United States Patent [19]

Gurtler

[11] 4,221,471
[45] Sep. 9, 1980

[54] LIQUID CRYSTAL MEMORY DEVICE AND METHOD OF UTILIZING SAME

[75] Inventor: Richard W. Gurtler, Mesa, Ariz.

[73] Assignee: Motorola, Inc., Schaumburg, Ill.

[21] Appl. No.: 809,746

[22] Filed: Jun. 24, 1977

Related U.S. Application Data

[63] Continuation of Ser. No. 591,561, Jun. 30, 1975, abandoned.

[51] Int. Cl.³ ............................................. G02F 1/133
[52] U.S. Cl. .................................................. 350/331 R
[58] Field of Search ..................... 350/160 LC, 331 R

[56] References Cited

U.S. PATENT DOCUMENTS

| 3,834,792 | 9/1974 | Janning | 350/160 LC |
| 3,854,751 | 12/1974 | Haas et al. | 350/160 LC |
| 3,876,287 | 4/1975 | Sprokel | 350/160 LC |
| 3,883,227 | 5/1975 | Kobayashi et al. | 350/160 LC |
| 3,930,719 | 1/1976 | Madrid et al. | 350/160 LC |
| 3,981,559 | 9/1976 | Channin | 350/160 LC |

*Primary Examiner*—Edward S. Bauer
*Attorney, Agent, or Firm*—Paul F. Wille

[57] ABSTRACT

A liquid crystal memory device comprising a liquid crystal layer, means for preconditioning the layer so that at least some of its molecules will be slanted towards one of two possible tilt directions, means for causing at least some of the molecules of said liquid crystal layer to assume their preconditioned tilt direction, and means for determining which of said possible tilt directions has been assumed by the molecules of said liquid crystal layer is disclosed. The method of writing into this device comprises causing the molecules of selected portions of said liquid crystal layer to be preconditioned to slant towards one of two possible tilt directions, causing at least some of said preconditioned molcules to assume their preconditioned tilt direction, causing at least some of the molecules of other portions of said liquid crystal layer to be preconditioned to slant towards the other one of said two possible tilt directions, and causing at least some of said preconditioned molecules to assume their other preconditioned tilt direction.

9 Claims, 12 Drawing Figures

LIQUID CRYSTAL MEMORY DEVICE AND METHOD OF UTILIZING SAME

This is a continuation of application Ser. No. 591,561, filed June 30, 1975, and now abandoned.

BACKGROUND OF THE INVENTION

This invention relates to a bistable tilt liquid crystal memory device and to a method of operating same in order to write, store and read information. More particularly, this invention relates to a liquid crystal memory device utilizing nematic liquid crystals.

Liquid crystal displays are used in various devices, for example, electronic watches and clocks, calculators, instruments such as voltmeters, indicators for temperature, pressure, humidity and speed, etc. Recently, a liquid crystal memory device has been disclosed in the art. This device, which is more fully described in U.S. Pat. No. 3,775,757, utilizes smectic C-phase liquid crystals, the molecules of which are normally tilted with respect to the surface of the display. Upon the application of polarized light in a certain direction, the molecules assume their complementary tilt angles. However, nematic liquid crystals are preferred in most commercial applications, since their properties are better understood and they are more generally available than the smectic C-phase type. Since nematic crystals do not have normal tilt angles and corresponding complementary tilt angles, their use in the device described in the aforementioned U.S. Pat. No. 3,775,757 is precluded.

SUMMARY OF THE INVENTION

In accordance with this invention, a liquid crystal memory device employing nematic liquid crystals is provided.

More in detail, the liquid crystal memory device of this invention comprises a liquid crystal layer disposed between front and rear plates; means for preconditioning the liquid crystal layer so that at least some of its molecules will be slanted towards one of two possible tilt directions; means for causing at least some of the molecules of said liquid crystal layer to assume their preconditioned tilt direction and means for determining which of said possible tilt directions has been assumed by the molecules of the liquid crystal layer.

This invention is also directed to a method of operating the liquid crystal memory device which comprises causing the molecules of selected portions of said liquid crystal layer to be preconditioned to slant towards one of two possible tilt directions; causing at least some of said preconditioned molecules to assume their preconditioned tilt direction; causing at least some of the molecules of other portions of the liquid crystal layer to be preconditioned to slant towards the other one of the two possible tilt directions and causing at least some of said preconditioned molecules to assume their other preconditioned tilt direction.

The liquid crystal memory device and method of this invention will be better understood by reference to the following description of the invention and the accompanying drawings.

DETAILED DESCRIPTION OF THE INVENTION

Figure 1:
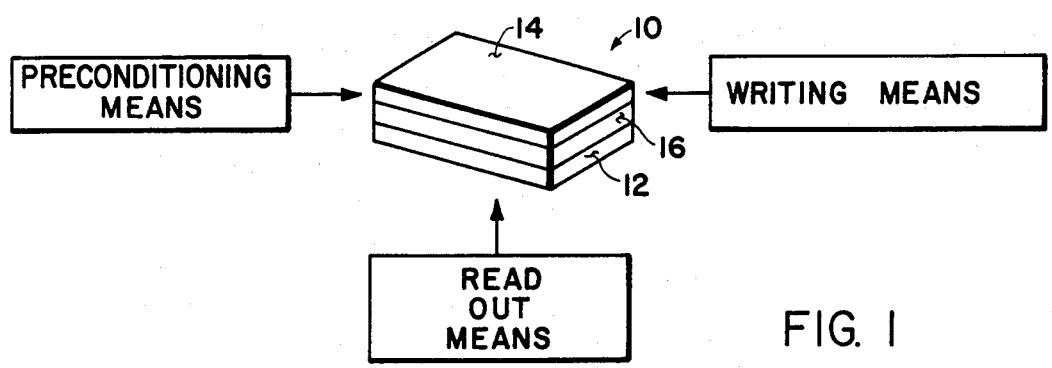
FIG. 1 is a block diagram of the liquid crystal memory device of the invention.

Referring to FIG. 1, there is shown a liquid crystal display 10 having a front transparent plate 12 and a rear transparent plate 14 disposed parallel to plate 12. By the term "front plate" in the claims and specification herein is meant the plate in the liquid crystal display which is first subjected to light from a light source. Plates 12 and 14 are made of any suitable transparent material, for example, glass, quartz, sapphire, etc. While the plates are shown as being transparent, they need not be where no optical means are employed in the operation of the device. Furthermore, even where optical means are employed, only the front plate need be transparent if a reflecting back electrode is employed. Spacer 16 is provided between the front transparent plate 12 and the rear transparent plate 14 in order to confine liquid crystal material between the two plates. For most applications, a space of about 0.1 to 2.0 mils between front and rear plate is provided. The spacer can be made of any appropriate material, for example plastic such as polytetrafluoroethylene, glass, metals, etc., and is secured to front and rear plates by conventional means such as epoxy cement.

The liquid crystal material disposed between plates 12 and 14, which is not observable in FIG. 1, is a nematic liquid crystal. Nematic liquid crystals are characterized by regional molecular ordering by approximate parallel alignment of the major axis of the molecules. For further description of these materials and their function, reference is made to the article "Liquid Crystal Displays" by R. W. Gurtler and C. Maze in *IEEE Spectrum*, November, 1972 which is hereby incorporated-by-reference. Illustrative materials suitable for use in the practice of the present invention are:

1. MBBA:PEBAB at 85:15 by weight where MBBA is N-(p-Methoxybenzylidene)-p-butylaniline and PEBAB is p-ethoxybenzylidene-p-amino-benzonitrile; and
2. Commercially available Kodak Field Effect Liquid Crystal Mixture Number 11900.

The liquid crystal memory device of FIG. 1 further includes preconditioning means, writing means and read-out means which will be described in greater detail hereinafter.

Figure 2:
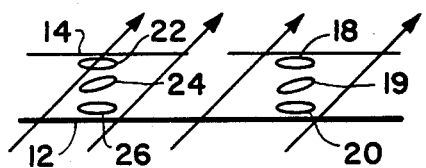
FIG. 2 shows the molecules of the liquid crystal memory device of this invention which have been preconditioned by the application of an appropriate magnetic field.

In FIG. 2 the interior surfaces of plates 12 and 14, i.e., the surfaces contiguous to the liquid crystal material, are treated to insure parallel alignment of the molecules of the liquid crystal with respect to the plates. This treatment may consist of rubbing or treating with a surfactant, for example vinyl trichlorosilane, or by vacuum deposition of thin layers of materials such as carbon or silicon monoxide onto the surfaces at high angles to provide orienting surfaces. These surface preparation procedures cause the molecules contiguous to the surfaces to align with a characteristic non-zero tilt. Depending on the direction of the treatment of the surfaces with respect to each other, a device may be fabricated which has either a "preferred" or "non-preferred" tilt behavior. Thus, referring to an assembled device, if the top plate has been rubbed from left to right and the bottom plate from right to left, or vice versa, the device will exhibit "preferred" tilt behavior. However, if both plates have been rubbed from left to right, or both from right to left, very little "preferred" tilt results and the molecules are most sensitive to a preconditioning field. Accordingly, non-preferred cells are often preferred in the practice of this invention, and are illustrated in most of the drawings.

In FIG. 2, the liquid crystal molecules represented by the numerals 18, 19 and 20 on the right side of the diagram and by the numerals 22, 24 and 26 on the left side of the diagram are aligned initially parallel to the plates. It should be noted that the liquid crystal material fills the space between the plates; the number of molecules shown in the drawings is for illustrative purposes only. A magnetic field is applied in a direction off the vertical in order to precondition the molecules. By the term "preconditioning" is meant that the molecules are slanted slightly toward the desired tilt direction. Thus, as shown in FIG. 2, molecules 19 and 24 begin to tilt in a direction parallel to the applied magnetic field. The molecules adjacent to the plates are held in a relatively fixed position due to the surface treatment of the plates referred to previously. The applied magnetic field is sufficient to slant the molecules but should not be strong enough to cause them to assume the preferred tilt; thus a field less than the threshold field is used. While the preconditioning magnetic field will obviously differ from the particular type of nematic crystal and surface treatment employed, a field of approximately 500 gauss is generally applied as compared to threshold fields of the order of 5 kilogauss.

Figure 3:
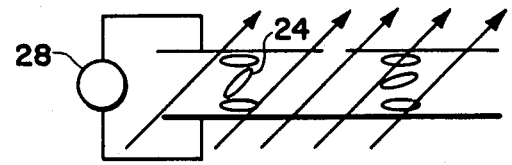
FIG. 3 shows the device of FIG. 2 wherein some of the preconditioned molecules have been caused to assume their preconditioned tilt direction by the application of an electric field.

In FIG. 3, some of the molecules which have been preconditioned by the magnetic field are then caused to assume their preconditioned tilt direction by the application of an electric field 28 to part of the cell. It will be apparent from FIG. 3 that molecule 24 has now tilted toward the desired configuration. The application of electric field 28 is the writing operation and places the molecule 24 in an ON or binary 1 condition. It will be noted that the field is applied only to those regions where a "1" is to be written or stored. A threshold voltage is necessary in order to write or turn the device on. Typically, 1–2 volts are required for this operation, although the specific voltage depends upon the particular nematic crystal employed.

Figure 4:
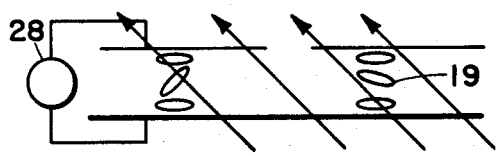
FIG. 4 shows the device of FIG. 3 wherein some of the remaining molecules have been preconditioned by a magnetic field to slant towards another tilt direction.

In the next step, as shown in FIG. 4, a preconditioning magnetic field similar to that described in FIG. 2 is applied in another direction. The application of this field causes molecules 19 to assume a second preconditioned tilt direction. However, since electric field 28 remains on, the molecules held by that electric field are not affected by the application of the second preconditioning magnetic field.

Figure 5:
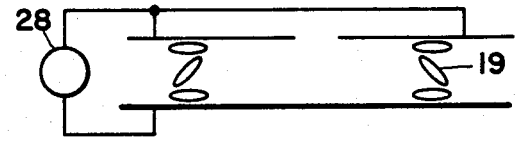
FIG. 5 shows the device of FIG. 4 wherein the second group of molecules have assumed their preconditioned tilt direction by the application of another electric field.

In FIG. 5, an electric field is also applied to the group of molecules which have been preconditioned by the second magnetic field, resulting in molecule 19 assuming the tilt depicted in the drawing. The application of the second electric field is another writing step indicating a binary 0 condition.

While preconditioning fields were employed in FIGS. 2–5 for both the binary 1 and 0 conditions, preconditioning is required only for the non-preferred tilt direction where a preferential cell is employed. However, a more sensitive device utilizes preconditioning for both directions.

Figure 7:
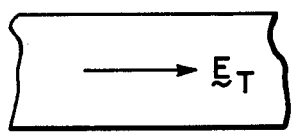
FIGS. 7-9 show the fields applied to the device of FIG. 6.
Figure 8:
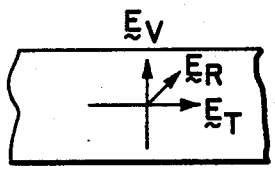
Figure 9:
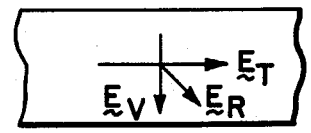
Figure 6:
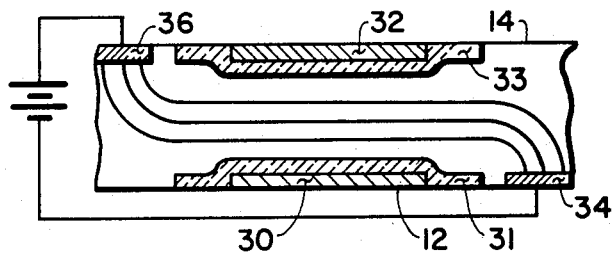
FIG. 6 illustrates another embodiment of this invention wherein preconditioning and writing is achieved by electric fields.

FIG. 6 illustrates one embodiment of a liquid crystal memory device according to this invention which utilizes an all-electric approach to preconditioning and writing. The interior surfaces of plates 10 and 12 are provided with a first set of electrodes 30 and 32 and a second set of electrodes 34 and 36. The electrodes are provided in a conventional manner, such as applying an optically transmissive conductive material by photoresist techniques or direct application followed by passivation with silicon dioxide 31 and 33. Typical optically transmissive conductive materials include indium oxide, tin oxide, etc. First a DC field is applied to the transverse electrodes 34 and 36 in order to establish a transverse field. Application of an AC field to electrodes 30 and 32 then combines with the transverse electric field to produce a net tilted electric field. Depending on the initial polarity of the applied AC field, a tilted electric field of either tilt may be obtained. For example, if as in FIG. 7, a transverse field, $E_T$, from left to right is imposed and then, as in FIG. 8 an AC field which is initially from bottom to top, $E_V$, is applied, the resultant electric field $E_R$ will be tilted from bottom to upper right which will cause the molecules to assume a bottom to upper right tilt. On the other hand if the initial field is from top to bottom as in FIG. 9, the resultant field will be as shown and result in molecular tilts to assume a bottom to upper left tilt. After the initial half-period of the AC field, the molecules will be committed to a particular tilt and as long as the above threshold AC field is retained, the initial tilt will be retained and in fact the DC transverse field may be removed.

It should be noted that a DC field is not necessary and AC fields for both the vertical and transverse can be used and the relative phases of the two signals will determine the tilt direction.

Figure 10:
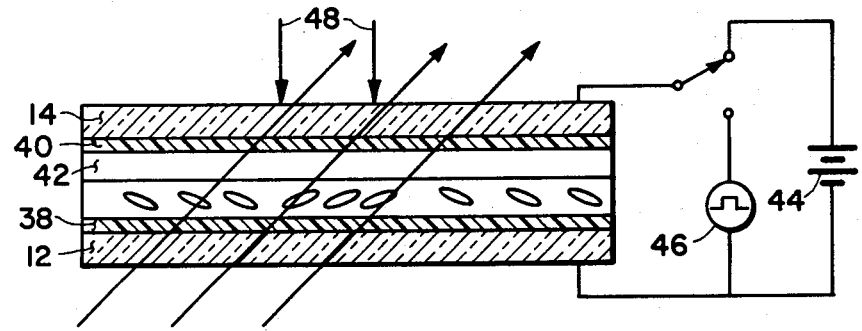
FIG. 10 illustrates another embodiment of the invention wherein a photoconductive layer is employed as an auxilliary means for writing by optical means.

In FIG. 10, the combination of magnetic, optical and electric means are employed in order to precondition and write in a preferential device. Thus, this system requires no electrode patterning as required with the electrically activated system previously described. Front plate 12 and rear plate 14 are provided with transparent electrode 38 and electrode 40. A layer of photoconductive material 42 is provided between rear electrode 40 and the liquid crystal material. Any photoconductive material sensitive to the spectrum used to write can be employed. One illustrative photoconductive material which is suitable for use in the practice of this invention is cadmium sulfide. The front and rear electrodes are connected by a DC power source 44 and an AC source 46. The magnetic field is used to precondition the molecules into the non-preferred direction for the preferential cell illustrated in the drawing. Then writing is achieved by applying light (represented by arrows 48) simultaneously with the application of the DC current. Voltage is applied to the liquid crystal molecules where the light hits the photoconductor causing activation of these regions into the non-preferred orientation. Then the magnetic field is removed, and the field changed to the AC current. This causes the molecules that have not been irradiated by light to go into the preferred tilt condition.

Figure 11:
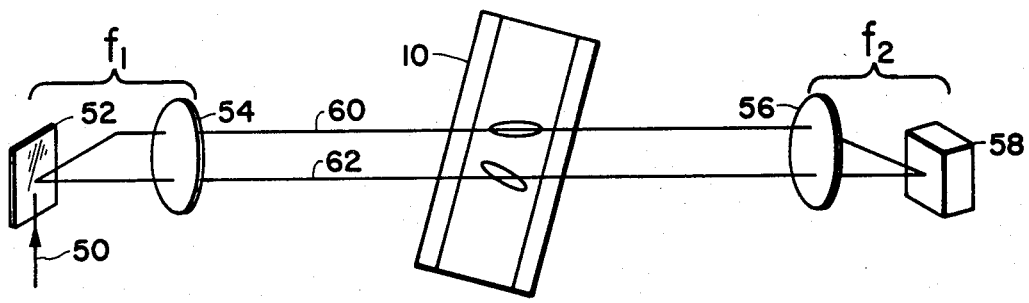
FIG. 11 illustrates an optical read-out system for the device of this invention.

Various readout means can be employed in the practice of this invention. For example, optical means such as shown in FIG. 11 can be used. In this system, a low power laser beam 50 is impinged upon galvanometer scanning mirror 52 and then passed through lense 54, liquid crystal display device 10, lense 56 and converged on common detector 58. Galvanometer scanning mirror 52 is positioned at the focal plane of lens 54 ($f_1$) and common detector 58 is placed at the focal plane of lense 58 ($f_2$) thus resulting in parallel beams passing through the cell. The polarized light beam traverses the cell, that is, beam 60 and beam 62 illustrate beams passed through the device at different times.

The molecules in the liquid crystal display device which are aligned with the beam act differently from those which are perpendicular to the beam, thus allowing a readout by detector 58. FIG. 11 represents only one arrangement for an optical read-out. Other systems may be used; for example an incandescent light source can be substituted for the laser beam and galvanometer scanning mirror in another embodiment. Furthermore other detection means may be employed. Thus, a CCD array detector can be used instead of a common detector, with or without lense 56 depending on the size of the detector with respect to the liquid crystal display device.

Figure 12:
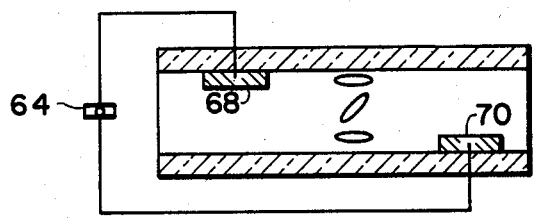
FIG. 12 shows an embodiment of the invention using an electrical read-out system.

Alternately electrical read-out means such as that illustrated in FIG. 12 can be employed. Thus, capacitance detector 64 is used to measure capacitance between electrodes 68 and 70, thereby detecting the orientation of the liquid crystal molecules. Instead of a capacitance detector, one could use a conductance detector as an electrical read-out means. Both of these techniques utilize the anisotropic nature of the liquid crystal molecule; that is properties such as the dielectric constant and conductivity are different parallel and perpendicular to the molecular axis.

In order to erase the information stored in the memory device of this invention, one merely takes away the writing means. In other words, where writing is effected by magnetic field, the field is removed and where writing is effected by an electric field, the field is turned off.

Although the Figures illustrate the application of certain types of fields for certain purposes, it should be recognized that the fields can be used interchangeably in the practice of this invention. Thus any combination of magnetic, electric and optical fields can be used to precondition, write and read. For example, magnetic fields can be used throughout; an electric field can be used to precondition and an optical field to write; an all optical system can be used, etc. Of course it will be recognized that structural modifications to the device must be made to allow for the use of the desired type of field. Furthermore, while operating conditions for certain fields have been discussed previously, it is noted that when an electric field is used for preconditioning, generally about 0.4 volts are required and when a magnetic field is used to write, 2–3 kilogauss are generally employed.

While the invention has been described with reference to nematic crystals, the display device known as a twisted nematic configuration can be employed. In this well known application, the plates are treated such that the molecules are twisted into the plane at one plate with respect to the molecules at the opposite plate.

The device and method in this invention offer numerous advantages. Thus, construction can be inexpensive since very thin cells are employed. Rapid reading is effected, writing is readily carried out and the device has very low power requirements. Furthermore, both binary positions can be retained with the same voltage, offering an advantage over present devices. Furthermore, a large amount of information can be readily stored.

Although the invention has been described in connection with certain preferred embodiments, it is not intended that the invention be limited thereto. Thus it is intended that the invention cover all alternatives, arrangements, equivalents, and embodiments that may be included within the scope of the following claims:

What is claimed is:

1. A liquid crystal memory comprising:
    a nematic liquid crystal material disposed between parallel front and rear plates;
    means for preconditioning at least some of the molecules of said liquid crystal material so that their major axes are slightly slanted from a plane parallel to said plates towards one of two possible tilt directions;
    writing means for causing at least some of the molecules of said liquid crystal material to assume said one of said two possible tilt directions at one or more first locations;
    means for preconditioning said liquid crystal layer so that at least some of its molecules at one or more second locations distinct from said first locations will have their major axes slightly slanted towards the other one of two possible tilt directions;
    writing means for causing said some but not all of the molecules of said liquid crystal layer to assume said other one of two possible tilt directions at said second locations; and
    means for determining which of said two possible tilt directions has been assumed by the molecules of said liquid crystal layer at said first and second locations.

2. The memory device of claim 1, wherein the long axes of said liquid crystal material are oriented parallel to said front and rear plates in the absence of any preconditioning or writing means.

3. The memory device of claim 1, wherein said liquid crystal material is disposed in a twisted nematic configuration.

4. The memory device of claim 1, wherein the means for preconditioning said molecules towards one of two possible tilt directions comprises surface treatment of one of said plates.

5. The memory device of claim 1, wherein said preconditioning means comprise a magnetic field.

6. The memory device of claim 1, wherein said writing means comprise an electric field.

7. The memory device of claim 1, wherein said preconditioning means comprise a magnetic field and said writing means comprise an electrical field.

8. The memory device of claim 1, wherein the means for determining which of said two possible tilt directions comprise optical beams.

9. The memory device of claim 1, wherein the means for determining which of said two possible tilt directions comprises capacitance discrimination.

* * * * *